(12) United States Patent
Huang et al.

(10) Patent No.: US 10,049,878 B2
(45) Date of Patent: Aug. 14, 2018

(54) SELF-ALIGNED PATTERNING PROCESS

(71) Applicant: Taiwan Semiconductor Manufacturing Company, Ltd., Hsin-Chu (TW)

(72) Inventors: Tsung-Min Huang, Taichung (TW); Chung-Ju Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/169,157

(22) Filed: May 31, 2016

(65) Prior Publication Data

US 2016/0276153 A1    Sep. 22, 2016

Related U.S. Application Data

(63) Continuation of application No. 14/042,896, filed on Oct. 1, 2013, now Pat. No. 9,368,348.

(51) Int. Cl.
| | |
|---|---|
| *H01L 21/033* | (2006.01) |
| *H01L 21/32* | (2006.01) |
| *H01L 21/768* | (2006.01) |
| *H01L 21/308* | (2006.01) |
| *H01L 21/027* | (2006.01) |

(52) U.S. Cl.
CPC ...... *H01L 21/0338* (2013.01); *H01L 21/0276* (2013.01); *H01L 21/0332* (2013.01); *H01L 21/0335* (2013.01); *H01L 21/0337* (2013.01); *H01L 21/3086* (2013.01); *H01L 21/32* (2013.01); *H01L 21/76811* (2013.01); *H01L 21/76816* (2013.01)

(58) Field of Classification Search
None
See application file for complete search history.

(56) References Cited

U.S. PATENT DOCUMENTS

| | | | |
|---|---|---|---|
| 6,475,891 B2 | 11/2002 | Moon | |
| 7,598,174 B1 | 10/2009 | Zhuang | |
| 8,057,692 B2 | 11/2011 | Park et al. | |
| 8,603,884 B2 | 12/2013 | Sills et al. | |
| 8,889,562 B2 | 11/2014 | Cheng et al. | |
| 9,059,115 B2 | 6/2015 | Kewley et al. | |
| 9,368,348 B2* | 6/2016 | Huang | H01L 21/0337 |
| 2006/0216923 A1* | 9/2006 | Tran | H01L 21/0337 438/622 |
| 2009/0263749 A1* | 10/2009 | Sim | H01L 21/0337 430/319 |
| 2009/0269924 A1* | 10/2009 | Choi | H01L 21/0337 438/669 |

(Continued)

*Primary Examiner* — Andres Munoz
(74) *Attorney, Agent, or Firm* — Slater Matsil, LLP

(57) ABSTRACT

Embodiments of the present disclosure are a method of forming a semiconductor device and methods of patterning a semiconductor device. An embodiment is a method of forming a semiconductor device, the method including forming a plurality of spacers over a first hard mask layer to form a first mask pattern, and forming a first photoresist over the plurality of spacers. The method further includes patterning the first photoresist to form a second mask pattern, and patterning the first hard mask layer using the first mask pattern and the second mask pattern in a same patterning step.

20 Claims, 3 Drawing Sheets

(56) References Cited

U.S. PATENT DOCUMENTS

| | | | | |
|---|---|---|---|---|
| 2010/0112818 A1* | 5/2010 | Zhou | ............ | H01L 21/0337 |
| | | | | 438/700 |
| 2011/0316165 A1* | 12/2011 | You | ............ | H01L 21/0337 |
| | | | | 257/773 |
| 2012/0108070 A1* | 5/2012 | Kim | ............ | H01L 21/3086 |
| | | | | 438/703 |
| 2013/0252425 A1* | 9/2013 | Lin | ............ | H01L 21/0337 |
| | | | | 438/692 |
| 2014/0367833 A1* | 12/2014 | Brink | ............ | H01L 21/3088 |
| | | | | 257/618 |
| 2015/0301447 A1* | 10/2015 | Shieh | ............ | G03F 7/20 |
| | | | | 430/314 |
| 2016/0086887 A1* | 3/2016 | Lee | ............ | H05K 1/0296 |
| | | | | 257/774 |

* cited by examiner

US 10,049,878 B2

SELF-ALIGNED PATTERNING PROCESS

This application is a continuation of U.S. patent application Ser. No. 14/042,896, entitled "Self-Aligned Patterning Process," filed on Oct. 1, 2013, which application is hereby incorporated herein by reference.

BACKGROUND

With the increasing down-scaling of semiconductor devices, various processing techniques, such as, photolithography are adapted to allow for the manufacture of devices with increasingly smaller dimensions. However, as semiconductor processes require smaller process windows, the manufacture of these devices have approached and even surpassed the theoretical limits of photolithography equipment. As semiconductor devices continue to shrink, the spacing desired between elements (i.e., the pitch) of a device is less than the pitch that can be manufactured using traditional optical masks and photolithography equipment.

One approach used to achieve the higher resolutions to manufacture, for example, 40 nm or smaller devices, is to use multiple pattern lithography. However, this additional patterning can cause overlay and shifting issues which decrease the yield and increase cost.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

Figure 1:
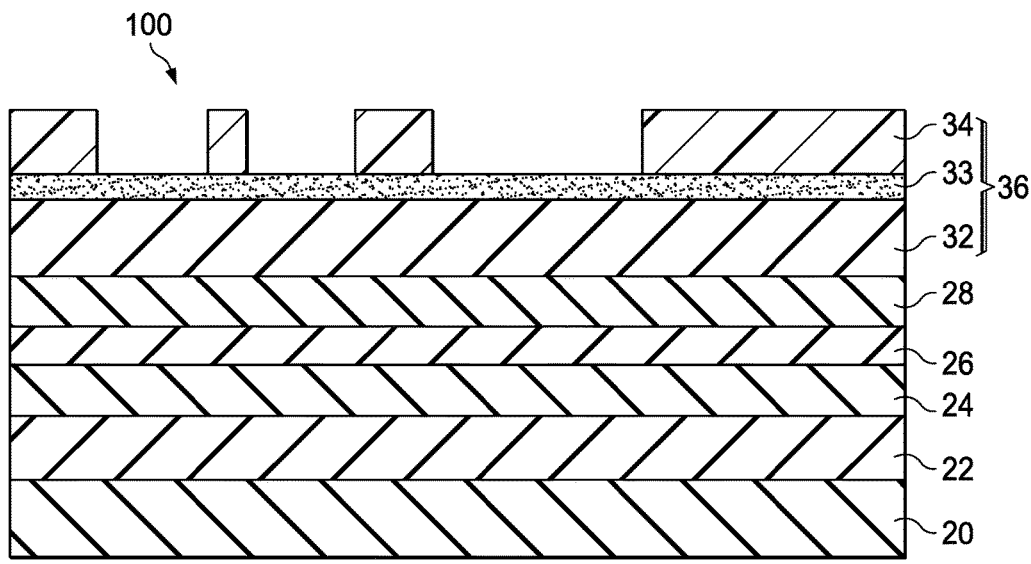
FIGS. 1 through 8 are cross-sectional views of intermediate stages in the patterning of a semiconductor device in accordance with various embodiments.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Embodiments will be described with respect to a method for patterning a semiconductor device layer by transferring multiple patterns to a hard mask layer over the semiconductor device layer. At least one of the patterns includes a sidewall aligned spacer conformally deposited over mandrels, the spacers being formed of a high etch selectivity material such as titanium nitride.

FIG. 1 illustrates a cross-sectional view of a semiconductor device 100 at an intermediate stage of processing. The semiconductor device 100 includes a semiconductor device layer 20, a hard mask layer 22, an optional anti-reflective layer (ARL) 24, hard mask layers 26 and 28, and a tri-layer photoresist 36 over the hard mask layers 26 and 28. The semiconductor device layer 20 is a layer that requires patterning. In some embodiments, the semiconductor device layer 20 is a metallic layer to be used for metal lines and is made of copper, aluminum, the like, or a combination thereof. In other embodiments, the semiconductor device layer 20 is a dielectric layer, a polymer layer, or the like. In yet other embodiments, the semiconductor device layer 20 is a substrate and is made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. In the embodiments wherein the semiconductor device layer 20 is not a substrate, a substrate (not shown) may be below the semiconductor device layer 20. The substrate (not shown) may be formed of similar materials as described above, and the description will not be repeated herein.

The substrate (not shown) or in the embodiment wherein the semiconductor device layer 20 is a substrate may include active and passive devices (not shown). As one of ordinary skill in the art will recognize, a wide variety of devices such as transistors, capacitors, resistors, combinations of these, and the like may be used to generate the structural and functional requirements of the design for the semiconductor device 100. The active and passive devices may be formed using any suitable methods.

The hard mask layer 22 is formed over the semiconductor device layer 20. In subsequent processing steps, a pattern is transferred onto the hard mask layer 22 using various photolithography and etching techniques. The hard mask layer 22 may then be used as a patterning mask for etching the underlying semiconductor device layer 20. The hard mask layer 22 may be a masking material such as titanium nitride, silicon nitride, silicon oxynitride, a poly-silicon, the like, or a combination thereof. The hard mask layer 22 may be formed using a process such as chemical vapor deposition (CVD), low pressure CVD (LPCVD), plasma enhanced CVD (PECVD), the like, or a combination thereof.

The optional anti-reflective layer (ARL) layer 24 may be formed over the hard mask layer 22. The ARL 24 prevents radiation in subsequent photolithographic processes from reflecting off layers below and interfering with the exposure process. Such interference can increase the critical dimension of the photolithography process. Sometimes the ARL 24 is referred to as an anti-reflective coating (ARC) 24. In some embodiments, the ARL 24 is a nitrogen-free ARL (NFARL) 24 and is made of a silicon-rich oxide (SRO), silicon oxycarbide, the like, or a combination thereof. In some embodiments, the ARL 24 is formed by PECVD, CVD, the like, or a combination thereof. In an embodiment, the ARL 24 is omitted.

The hard mask layer 26 may be deposited over the hard mask layer 22 and the ARL 24, if present. The hard mask layer 26 may be used as a masking pattern for the hard mask layer 22. In subsequent processing steps, the hard mask layer 26 is patterned by multiple patterns (see FIG. 7) which may then be transferred to the hard mask layer 22. The hard mask layer 26 may be a masking material such as silicon nitride, silicon oxynitride, amorphous silicon, a poly-silicon, the like, or a combination thereof. The hard mask layer 26 may be formed using a process such as CVD, LPCVD, PECVD, the like, or a combination thereof.

The hard mask layer 28 is formed over the hard mask layer 26. The hard mask layer 28 may be used to form mandrels 28' (see FIG. 2) and will be referred to as a mandrel layer 28 hereinafter. The mandrel layer 28 may be a masking material such as an ashable hard mask (e.g. amorphous silicon or amorphous carbon) silicon nitride, silicon oxynitride, a nitride, an oxide, a poly-silicon, a low temperature metal film such as titanium oxide or titanium nitride, the like, or a combination thereof or any other material that may be patterned and selectively removed. The mandrel layer 28 may be formed using a process such as CVD, LPCVD, PECVD, atomic layer deposition (ALD), the like, or a combination thereof.

A tri-layer photoresist 36 is formed over the mandrel layer 28. The tri-layer photoresist 36 includes a top photoresist layer 34, a middle layer 33, and a bottom layer 32. As the limits of photolithography processes are reached by advanced semiconductor manufacturing processes, the need for thinner top photoresist layers has arisen to achieve smaller process windows. However, thin top photoresist layers may not be sufficiently robust to support the etching of target layers (e.g., the mandrel layer 28). The tri-layer photoresist provides a relatively thin top photoresist layer 34. The tri-layer photoresist 36 further includes a middle layer 33, which may include anti-reflective materials (e.g., a backside anti-reflective coating (BARC) layer) to aid the exposure and focus of the top photoresist layer 34's processing. In some embodiments, by having the middle layer 33, the thin top photoresist layer 34 is only used to pattern the middle layer 33. The tri-layer photoresist 36 further includes a bottom layer 32, which may comprise a hard mask material such as a nitride (e.g., SiON). The middle layer 33 is then used to pattern the bottom layer 33. In some embodiments, the middle layer 33 has a high etch selectivity to the bottom layer 32, and, in some embodiments, the bottom layer 32 is more than ten times thicker than the middle layer 33. Thus, the tri-layer photoresist 36 allows for the robust patterning of underlying layers (e.g., the mandrel layer 28) while still providing a relatively thin top photoresist layer 34.

The top photoresist layer 34 may be patterned using any suitable photolithography technique. For example, a photomask (not shown) may be disposed over the top photoresist layer 34, which may then be exposed to radiation such as ultraviolet light or an exciser laser. Exposure of the top photoresist layer 34 may be performed using an immersion lithography system to increase resolution and decrease the minimum achievable pitch. A bake or cure operation may be performed to harden the top photoresist layer 34, and a developer may be used to remove either the exposed or unexposed portions of the top photoresist layer 34 depending on whether a positive or negative resist is used. Thus, a pattern such as the pattern illustrated in FIG. 1 is formed in the top photoresist layer 34. FIG. 1 illustrates four separate sections of the photoresist 36, there may be more or less sections depending on the number of mandrels 28' that are desired (see FIG. 2).

Figure 2:
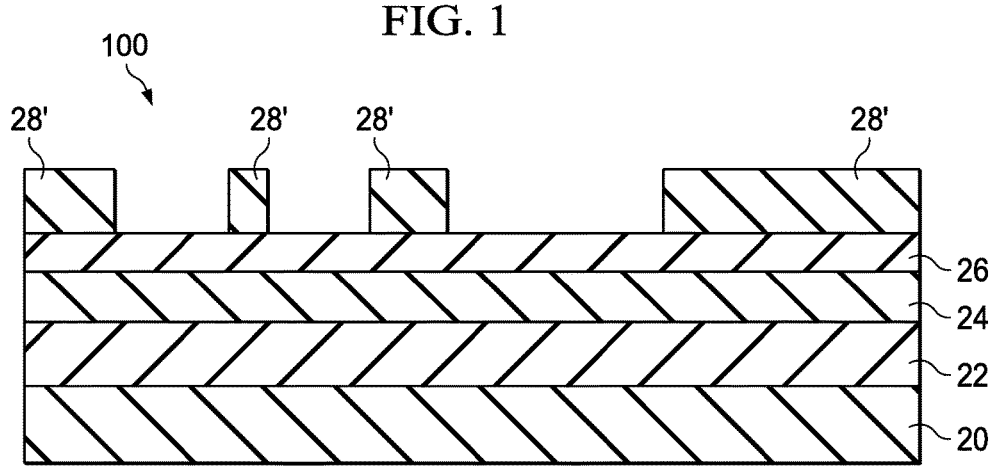

FIG. 2 illustrates the resulting structure after the mandrel layer 28 has been patterned. After developing and patterning the top photoresist layer 34, the pattern is transferred to the middle and bottom layers 33 and 32, respectively. The pattern may be transferred, for example, by one or more selective etching processes. After the selective etching processes, the top photoresist layer 34 and the middle layer 33 may be removed by, for example, a trimming process such as an anisotropic plasma etch process. In some embodiments, portions of the bottom layer 32 are also removed during the trimming process to achieve a more stable aspect-ration for subsequent etching steps. In an embodiment, the mandrel layer 28 is etched using the bottom layer 32 as a patterning mask forming the mandrels 28'. In this embodiment, the remaining portions of the bottom layer 32 are removed by, for example, a wet clean process. In another embodiment, the trimming process is omitted, and the mandrel layer 28 is patterned using all three of three layers (34, 33, and 32) of the tri-layer photoresist 36 forming the mandrels 28'.

Figure 3:
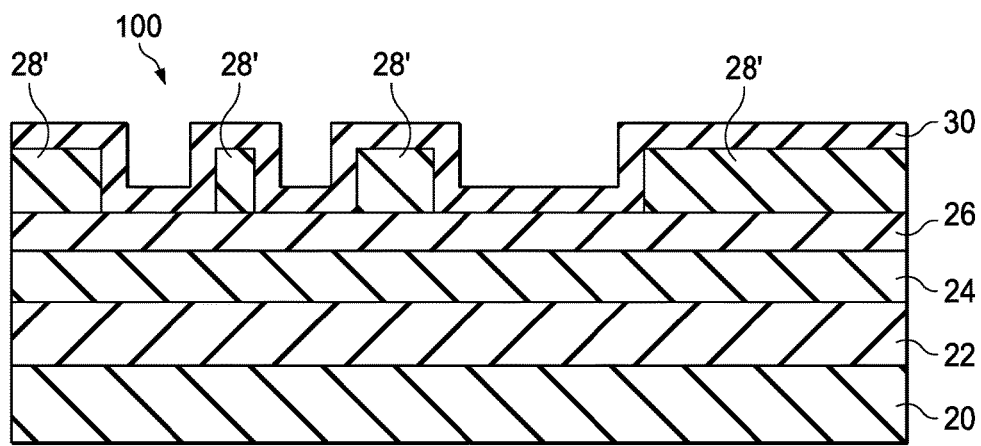

FIG. 3 illustrates the formation of a spacer layer 30 over the hard mask layer 28 and the mandrels 28'. In an embodiment, the spacer layer 30 is conformally deposited over the hard mask layer 28 and the mandrels 28' such that the thickness of the spacer layer 30 on the top surface of the hard mask layer 26 and the sidewalls of the mandrels 28' is substantially a same thickness. In some embodiments, the spacer layer 30 is a metal-containing spacer layer 30 and is made of, titanium nitride, titanium oxide, the like, or a combination thereof. The material of the spacer layer 30 is selected to have a high etch selectivity to the hard mask layer 26 so that subsequent etching steps may be performed on the spacer layer 30 without attacking the hard mask layer 26 (e.g. see FIG. 4) The spacer layer 30 may be deposited through a process such as physical vapor deposition (PVD), ALD, CVD, although any acceptable process may be utilized to form the spacer layer 30 to a thickness between about 100 Å to about 250 Å. Further, the thickness of the spacer layer 30 may be selected to determine the thickness of features eventually formed in the semiconductor device layer 20.

Figure 4:
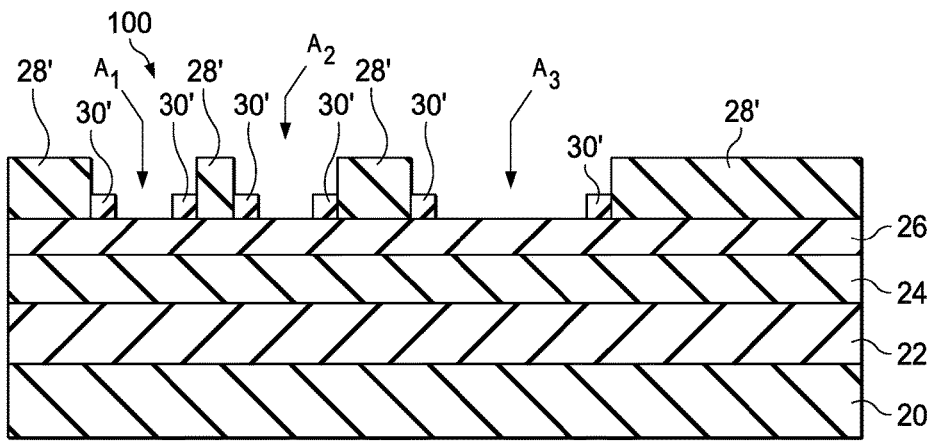

FIG. 4 illustrates etching the spacer layer 30 to expose the mandrels 28' and form spacers 30'. The spacers 30' form a first mask pattern (e.g. line A pattern) including a first opening $A_1$, a second opening $A_2$, and a third opening $A_3$. Each of the openings $A_1$, $A_2$, and $A_3$ are defined by a pair of adjacent spacers 30' The top portions of the spacer layer 30 may be anisotropically etched to expose the underlying mandrels 28' and hard mask layer 26. In some embodiments, the etchant used to etch the top portions of the spacer layer 30 is $Cl_2$, $CH_4$, $N_2$, Ar the like, or a combination thereof. In an embodiment wherein the hard mask layer 26 is amorphous silicon and the spacer layer 30 is titanium nitride, a high etch selectivity is provided between the hard mask layer 26 and the spacer layer 30 during the spacer etch process.

Figure 5:
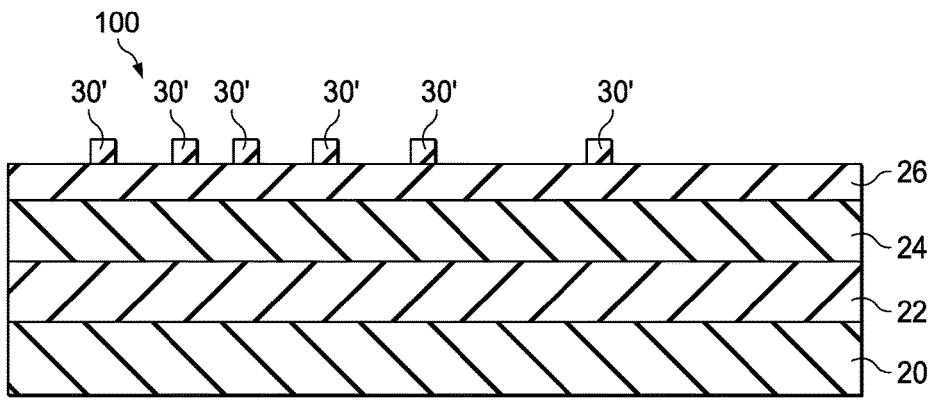

After the spacer layer 30 is etched, the mandrels 28' may be removed as illustrated in FIG. 5. In an embodiment, the mandrels 28' are by an etch process including etchants such as $CF_4$, $CH_3F$, $H_2$, $N_2$, Ar, the like, or a combination thereof or any other suitable etchant that can remove the mandrels 28' without damaging the spacers 30'. Further, a wet clean process may also be applied to semiconductor device 100 to remove residual spacer and mandrel material. In some embodiments, the spacer etch and the mandrel removal processes are performed in a same process chamber.

By removing the mandrels 28' before forming the second mask pattern (see FIGS. 6-7), the first and second mask patterns may be transferred to the hard mask layer 26 with a same patterning step which helps to prevent depth loading issues. Also, by removing the mandrels 28' before the second mask pattern is formed, the overlay window for the second mask pattern is enlarged.

Figure 6:
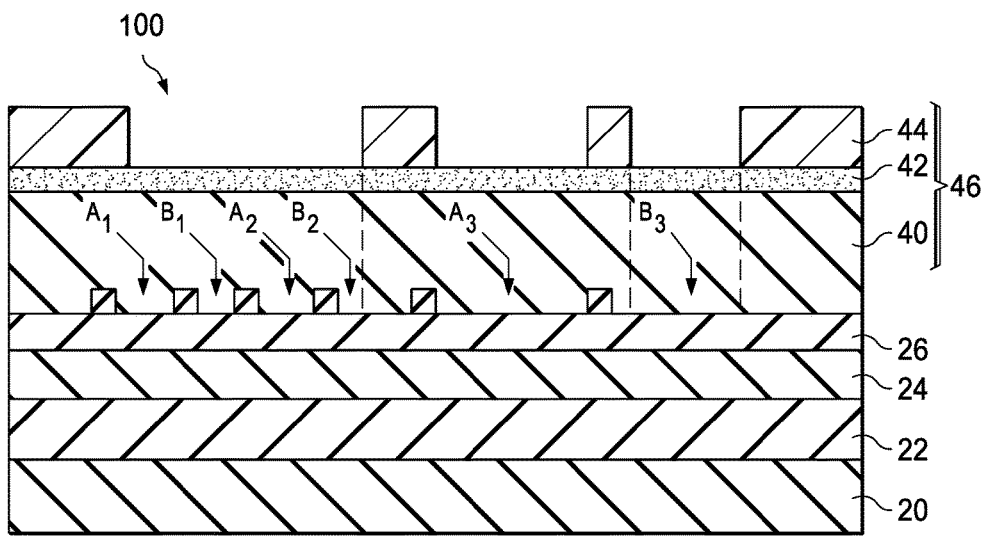

FIG. 6 illustrates the formation of a tri-layer photoresist 46 over the spacers 30' and the hard mask layer 26. The tri-layer photoresist 46 may be substantially similar to tri-layer photoresist 36 and includes a relatively thin top photoresist layer 44, a middle layer 42 (e.g., a BARC), and a bottom layer 40 (e.g., a hard mask material).

The top photoresist layer 44 may be patterned, for example, by using an immersion photolithography system to expose portions of top photoresist layer 44 and developing the exposed/unexposed portions depending on whether a positive/negative photoresist is used. The top photoresist layer 44 is patterned to form a second mask pattern (e.g. line B pattern) to be transferred to the hard mask layer 26 in addition to the first mask pattern formed by the spacers 30'. The second mask pattern includes a first opening $B_1$, a second opening $B_2$, and a third opening $B_3$. In the illustrated embodiment, the first opening $B_1$ is defined by the removed mandrel 28' between a pair of spacers 30' (see FIG. 4), the second opening $B_2$ is defined by a spacer 30' and a patterned portion of the tri-layer photoresist 46, and the third opening $B_3$ is defined by a pair of patterned portions of the tri-layer photoresist 46. The second pattern shown in FIG. 6 is for illustrative purposes only and different patterns may be formed depending on the design of semiconductor device 100.

Figure 7:
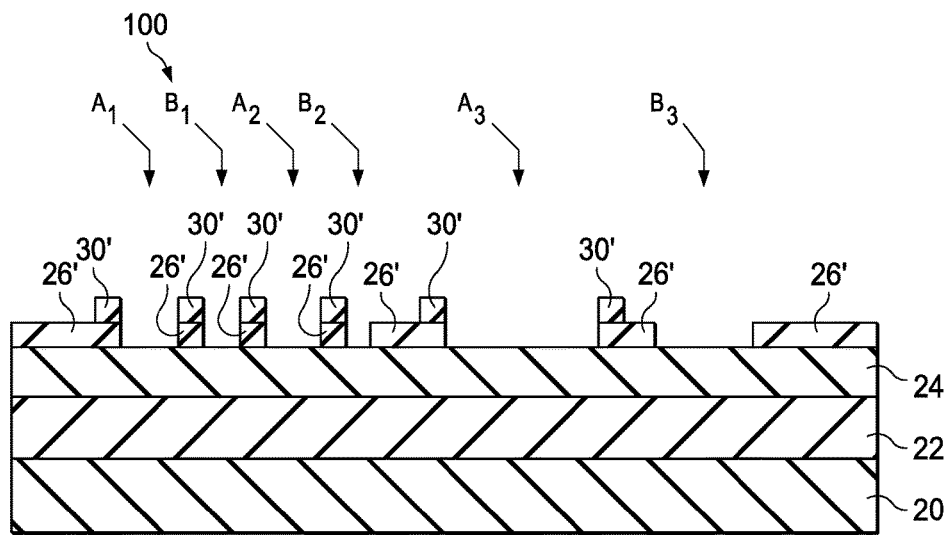

FIG. 7 illustrates the patterning of the hard mask layer 26 using both the first mask pattern formed by the spacers 30' and the second mask pattern formed by the tri-layer photoresist 46 and the spacers 30' in a same patterning step. The hard mask layer 26 may be patterned by any suitable chemical, such as $CF_4$, HBr, $Cl_2$, $O_2$, Ar, the like, or a combination thereof. By patterning hard mask layer 26 with both the first mask pattern and the second mask pattern in a same patterning step, depth loading issues between the two mask patterns (e.g. line pattern A and line pattern B) are prevented.

Figure 8:
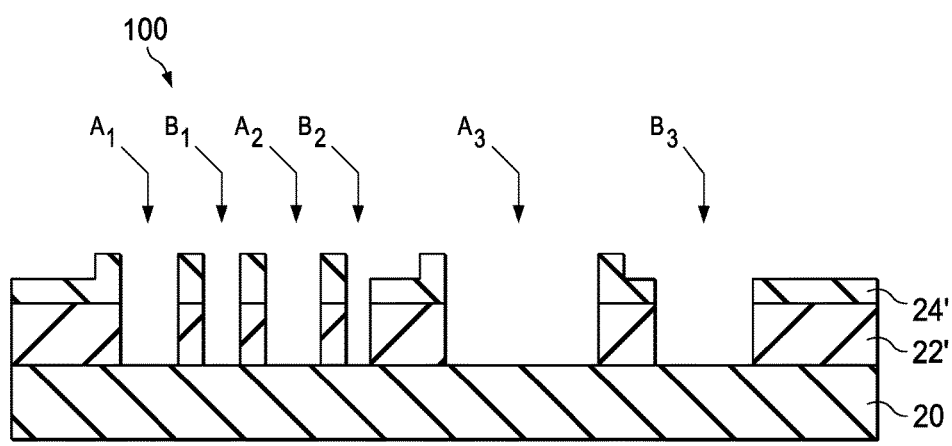

FIG. 8 illustrates the patterning of the ARL layer 24, if present, and the hard mask layer 22 using the patterned hard mask layer 26 as a mask. The ARL layer 24 may be patterned by an etch process including etchants such as C4F8, N2, O2, Ar, the like, or a combination thereof. The hard mask layer 22 may be patterned by an etching process including etchants such as C12, N2, CH4, the like, or a combination thereof. In a subsequent process step (not shown), the patterned hard mask layer 22' may be used to transfer the illustrated pattern to the semiconductor device layer 20, for example, through an etching process using patterned hard mask 22' as a patterned mask.

By removing the mandrels 28' before forming the second mask pattern (see FIGS. 5-7), the first and second mask patterns may be transferred to the hard mask layer 26 with a same patterning step which helps to prevent depth loading issues. Also, by removing the mandrels 28' before the second mask pattern is formed, the overlay window for the second mask pattern is enlarged. Further, the mandrels 28' may be made of various materials as they do not define the second mask pattern which would limit the material choices.

An embodiment is a method of forming a semiconductor device, the method including forming a plurality of spacers over a first hard mask layer to form a first mask pattern, and forming a first photoresist over the plurality of spacers. The method further includes patterning the first photoresist to form a second mask pattern, and patterning the first hard mask layer using the first mask pattern and the second mask pattern in a same patterning step.

Another embodiment is a method of patterning a semiconductor device, the method including forming a first hard mask layer over a semiconductor device layer, forming a second hard mask layer over the first hard mask layer, patterning the second hard mask layer to form a plurality of second hard mask portions, and forming a metal-containing spacer layer over the plurality second hard mask portions. The method further includes etching the metal-containing spacer layer to form a plurality of spacers on sidewalls of the plurality of second hard mask portions, removing the second hard mask portions, forming a first photoresist over the plurality of spacers, patterning the first photoresist, and patterning the first hard mask layer using the plurality of spacers and the patterned first photoresist as a mask.

A further embodiment is a method of patterning a semiconductor device, the method including forming a second hard mask layer over a first hard mask layer, patterning the second hard mask layer to form a plurality of second hard mask portions, forming a plurality of spacers on sidewalls of the plurality of second hard mask portions, and removing the second hard mask portions form between the plurality of spacers, the plurality of spacers forming a first mask pattern. The method further includes forming a tri-layer photoresist over the plurality of spacers, patterning the tri-layer photoresist to form a second mask pattern, and patterning the first hard mask layer using the first mask pattern and the second mask pattern in a same patterning step.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
   forming a second hard mask layer over a first hard mask layer;
   patterning the second hard mask layer using a first patterned photoresist as a mask;
   forming metal-containing spacers on sidewalls of the patterned second hard mask layer and over the first hard mask layer;
   forming and patterning a second photoresist over the metal-containing spacers and the first hard mask layer; and
   patterning the first hard mask layer using the metal-containing spacers and the patterned second photoresist in a single patterning step, wherein none of the metal-containing spacers is removed between forming the metal-containing spacers and forming the second photoresist.

2. The method of claim 1 further comprising:
forming a first photoresist on the second hard mask layer; and
patterning the first photoresist to form the first patterned photoresist.

3. The method of claim 1, wherein the forming the metal-containing spacers on sidewalls of the patterned second hard mask layer and over the first hard mask layer comprises:
forming a metal-containing spacer layer over the patterned second hard mask layer;
etching the metal-containing spacer layer to form the metal-containing spacers, top surfaces of the patterned second hard mask layer being exposed; and
removing the patterned second hard mask layer from between the metal-containing spacers.

4. The method of claim 3, wherein the steps of etching the metal-containing spacer layer and removing the patterned second hard mask layer are performed in a same process chamber.

5. The method of claim 1, wherein the first patterned photoresist and the second photoresist are each tri-layer photoresists comprising a top photoresist layer, a middle layer, and a bottom layer, wherein the middle layer comprises an anti-reflective material, and wherein the bottom layer comprises a hard mask material.

6. The method of claim 1 further comprising:
forming an anti-reflective layer on a third hard mask layer; and
forming the first hard mask layer on the anti-reflective layer, the second hard mask layer being formed on the first hard mask layer.

7. The method of claim 1, wherein the metal-containing spacers are formed of titanium oxide.

8. The method of claim 1, wherein the metal-containing spacers are formed of titanium nitride.

9. A method comprising:
disposing a first hard mask layer over a target layer;
disposing a second hard mask layer over the first hard mask layer;
patterning the second hard mask layer using a patterned first photoresist as a mask;
removing the patterned first photoresist;
disposing a metal-containing spacer layer over the patterned second hard mask layer;
etching the metal-containing spacer layer to form metal-containing spacers on sidewalls of the patterned second hard mask layer;
removing the patterned second hard mask layer, wherein none of the metal-containing spacers formed by etching the metal-containing spacer layer is removed before removing the patterned second hard mask layer;
disposing and patterning a second photoresist over the metal-containing spacers and contacting the first hard mask layer; and
while the patterned second photoresist contacts the first hard mask layer, patterning the first hard mask layer using the metal-containing spacers and the patterned second photoresist as a mask.

10. The method of claim 9, wherein the second photoresist comprises a plurality of layers with one of the plurality of layers being an anti-reflective material.

11. The method of claim 9, wherein the second photoresist is a tri-layer photoresist comprising a top photoresist layer, a middle layer, and a bottom layer, wherein the middle layer comprises an anti-reflective material, and wherein the bottom layer comprises a hard mask material.

12. The method of claim 9, wherein the metal-containing spacer layer comprises titanium.

13. The method of claim 9 further comprising:
disposing a third hard mask layer over the target layer;
disposing an anti-reflective layer on the third hard mask layer; and
disposing the first hard mask layer on the anti-reflective layer.

14. The method of claim 13, wherein the third hard mask layer comprises titanium nitride, wherein the anti-reflective layer comprises a nitrogen-free anti-reflective layer, wherein the first hard mask layer comprises amorphous silicon, wherein the second hard mask layer comprises an ashable hard mask, and wherein the metal-containing spacer layer comprises titanium nitride.

15. The method of claim 9, wherein the target layer consists essentially of copper, aluminum, or a combination thereof.

16. A method comprising:
depositing a first hard mask layer over a target layer;
forming a mandrel layer over the first hard mask layer;
patterning the mandrel layer using a patterned first photoresist as a mask to form mandrels;
removing the patterned first photoresist;
conformally forming a metal-containing spacer layer over the mandrels and the first hard mask layer;
etching the metal-containing spacer layer to form metal-containing spacers on sidewalls of the mandrels;
removing the mandrels to expose portions of the first hard mask layer, wherein none of the metal-containing spacers formed by etching the metal-containing spacer layer is removed before removing the mandrels to expose the portions of the first hard mask layer;
forming and patterning a second photoresist over the metal-containing spacers, the second photoresist contacting the metal-containing spacers and the first hard mask layer; and
patterning the first hard mask layer using the metal-containing spacers and the patterned second photoresist as a mask, the patterned second photoresist being present during the patterning of the first hard mask layer using the metal-containing spacers.

17. The method of claim 16 further comprising:
forming a third hard mask layer over the target layer;
forming an anti-reflective layer on the third hard mask layer, the first hard mask layer being over the anti-reflective layer;
patterning the anti-reflective layer and the third hard mask layer using the patterned first hard mask layer as a mask; and
patterning the target layer using the patterned third hard mask layer as a mask.

18. The method of claim 16, wherein the second photoresist is a tri-layer photoresist comprising a top photoresist layer, a middle layer, and a bottom layer, wherein the middle layer comprises an anti-reflective material, and wherein the bottom layer comprises a hard mask material.

19. The method of claim 16, wherein the metal-containing spacer layer comprises titanium.

20. The method of claim 16, wherein the steps of etching the metal-containing spacer layer and removing the mandrels are performed in a same process chamber.

* * * * *